United States Patent
Hayashi et al.

(10) Patent No.: US 12,078,343 B2
(45) Date of Patent: *Sep. 3, 2024

(54) LIGHT EMITTING DEVICE

(71) Applicant: NICHIA CORPORATION, Anan (JP)

(72) Inventors: Yusuke Hayashi, Anan (JP); Satoshi Shichijo, Tokushima (JP); Hiroki Fukuta, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/451,215

(22) Filed: Aug. 17, 2023

(65) Prior Publication Data

US 2023/0392769 A1 Dec. 7, 2023

Related U.S. Application Data

(63) Continuation of application No. 18/068,175, filed on Dec. 19, 2022, now Pat. No. 11,767,967.

(30) Foreign Application Priority Data

Dec. 24, 2021 (JP) .................................. 2021-211186

(51) Int. Cl.
*F21V 9/30* (2018.01)
*F21V 7/04* (2006.01)

(52) U.S. Cl.
CPC . *F21V 9/30* (2018.02); *F21V 7/04* (2013.01)

(58) Field of Classification Search
CPC .................................... F21V 9/30; F21V 7/04
See application file for complete search history.

(56) References Cited

U.S. PATENT DOCUMENTS

| 11,767,967 B2* | 9/2023 | Hayashi | F21V 9/30 |
|---|---|---|---|
| | | | 362/84 |
| 2015/0054011 A1 | 2/2015 | Koizumi et al. | |
| 2015/0316215 A1 | 11/2015 | Togawa | |
| 2018/0029523 A1 | 2/2018 | Shichijo | |
| 2018/0351053 A1 | 12/2018 | Yuasa et al. | |
| 2019/0326491 A1 | 10/2019 | Koike et al. | |
| 2020/0309346 A1 | 10/2020 | Iwasa et al. | |
| 2021/0317958 A1 | 10/2021 | Kageyama et al. | |

FOREIGN PATENT DOCUMENTS

| JP | 2006-156604 A | 6/2006 |
|---|---|---|
| JP | 2010-157638 A | 7/2010 |
| JP | 2010-192629 A | 9/2010 |

(Continued)

*Primary Examiner* — Mary Ellen Bowman
(74) *Attorney, Agent, or Firm* — Foley & Lardner LLP

(57) ABSTRACT

A light emitting device includes: a substrate; a light emitting element disposed on the substrate; a first wavelength conversion member disposed on the light emitting element and having a lower surface bonded to the light emitting element, an upper surface opposite the lower surface, and a lateral surface that meets the upper surface; a first light reflecting member disposed on an upper surface of the substrate and covering lateral surfaces of the light emitting element; and a second wavelength conversion member disposed on the first light reflecting member, on the upper surface of the substrate, and on the lateral surface of the first wavelength conversion member without covering the upper surface of the first wavelength conversion member.

15 Claims, 16 Drawing Sheets

(56) References Cited

FOREIGN PATENT DOCUMENTS

| | | |
|---|---|---|
| JP | 2010-219324 A | 9/2010 |
| JP | 2010-238846 A | 10/2010 |
| JP | 2015-041709 A | 3/2015 |
| JP | 2018-022723 A | 2/2018 |
| JP | 2018-082027 A | 5/2018 |
| JP | 2018-082197 A | 5/2018 |
| JP | 2018-206853 A | 12/2018 |
| JP | 2019-192716 A | 10/2019 |
| JP | 2020-057673 A | 4/2020 |
| JP | 2020-161773 A | 10/2020 |
| JP | 2021-027255 A | 2/2021 |
| JP | 2021-168374 A | 10/2021 |
| WO | WO-2014/087938 A1 | 6/2014 |
| WO | WO-2021/166684 A1 | 8/2021 |

* cited by examiner

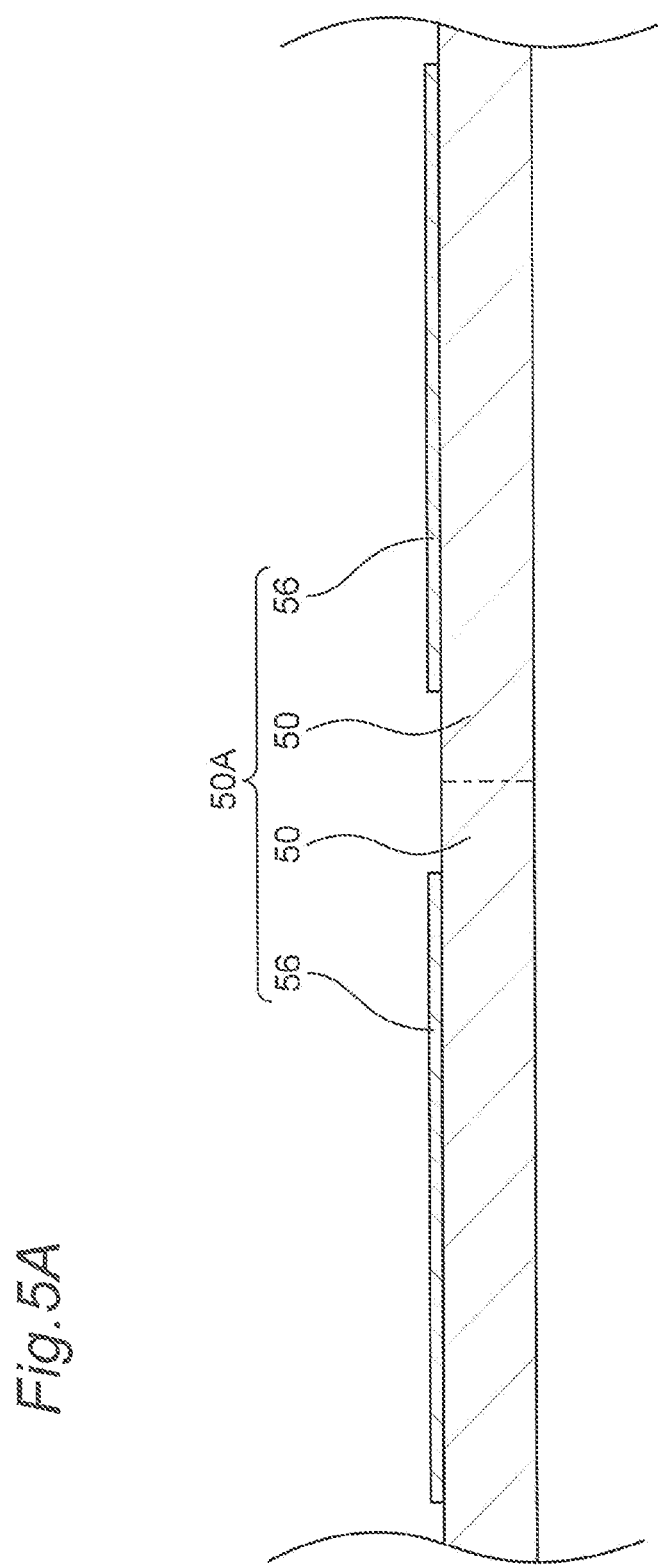

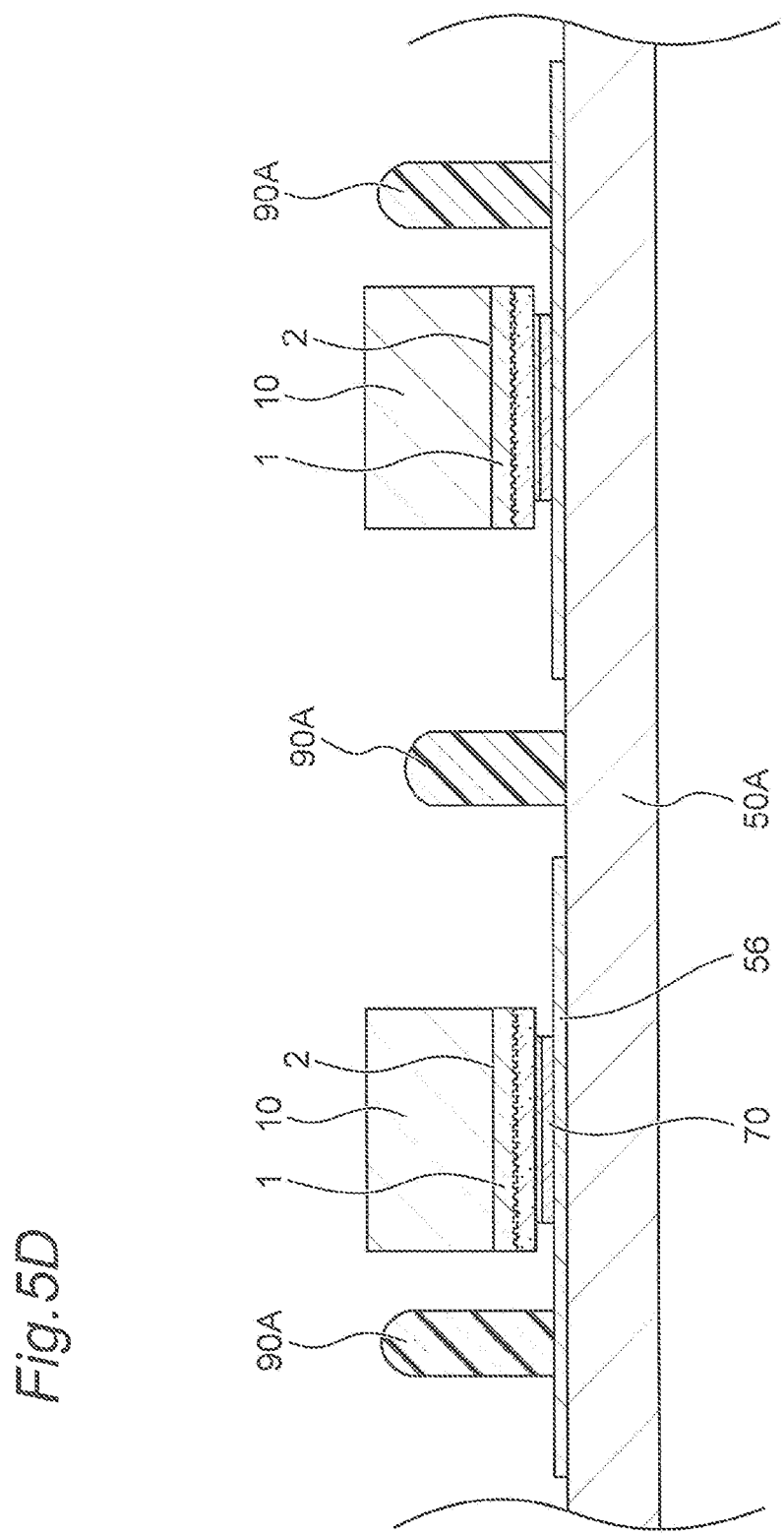

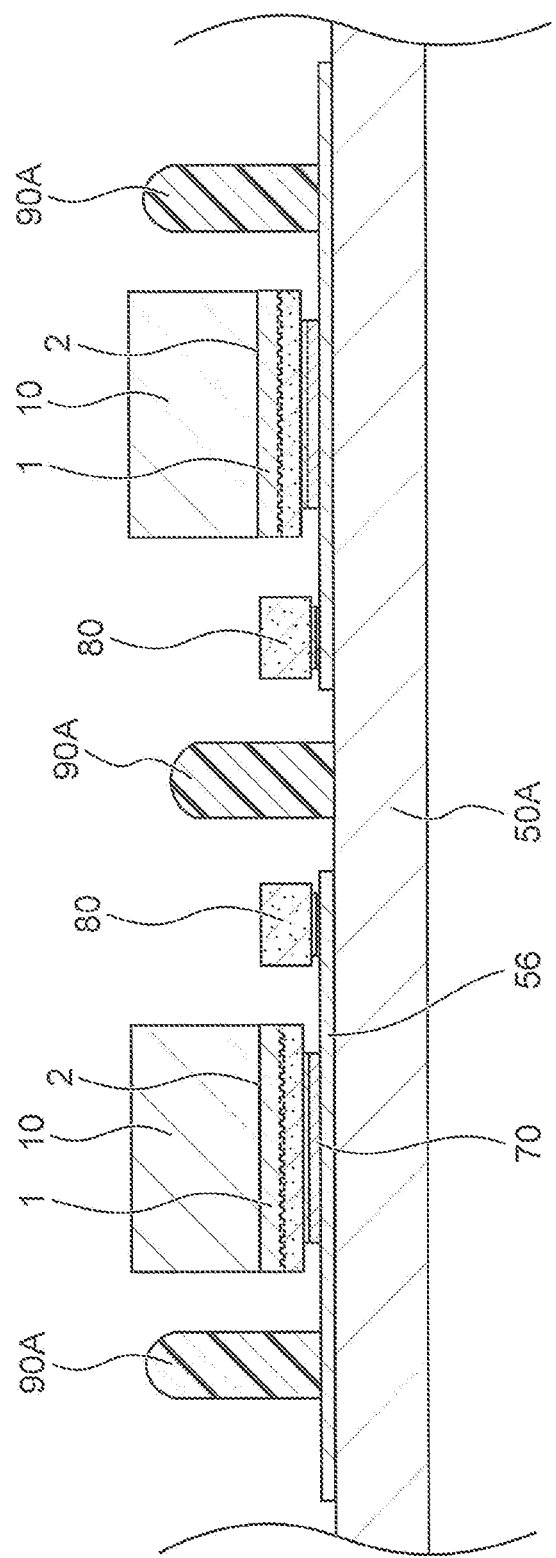

LIGHT EMITTING DEVICE

CROSS REFERENCE TO RELATED APPLICATION

This application is a continuation of U.S. patent application Ser. No. 18/068,175, filed on Dec. 19, 2022, which claims priority to Japanese Patent Applications No. 2021-211186, filed on Dec. 24, 2021, the entire contents of which are hereby incorporated by reference.

BACKGROUND

The present disclosure relates to a light emitting device.

In recent years, there has been a rise in demand for a light emitting device configured to emit light having a chromaticity within a desired range among white-light emitting devices. For example, Japanese Patent Publication No. 2018-082027 discloses a light emitting device in which the color temperature of the emitted light is adjusted by the phosphor layer that covers the lateral surfaces of the light emitting element.

SUMMARY

The light emitting device disclosed in the Japanese Patent Publication No. 2018-082027, however, still has room for improvement in terms of the light extraction efficiency.

The object of the present disclosure is to increase the light extraction efficiency of a light emitting device capable of emitting light having chromaticity within a desired range.

According to one embodiment of the present disclosure, a light emitting device includes a light emitting element that emits first light, a first wavelength conversion member disposed on the light emitting element and having a lower surface bonded to the light emitting element, an upper surface opposite the lower surface, and a lateral surface connected to the upper surface, the first wavelength conversion member emitting second light when excited by the first light, a second wavelength conversion member covering the lateral surface of the first wavelength conversion member except the upper surface of the first wavelength conversion member and having an oblique surface extending from the lateral surface of the first wavelength conversion member to the outer side, the second wavelength conversion member emitting third light when excited by at least one of the first light and the second light, and a first light reflecting member covering the oblique surface.

According to an embodiment of the present disclosure, the light extraction efficiency of a light emitting device configured to emit light having chromaticity within a desired range can be increased.

BRIEF DESCRIPTION OF THE DRAWINGS

FIG. 5A is a schematic cross-sectional view showing a step in a method of manufacturing a light emitting device according to the first embodiment.

FIG. 5D is a schematic cross-sectional view showing a step in the method of manufacturing a light emitting device according to the first embodiment.

FIG. 5E is a schematic cross-sectional view showing a step in the method of manufacturing a light emitting device according to the first embodiment.

DETAILED DESCRIPTION

Figure 1:
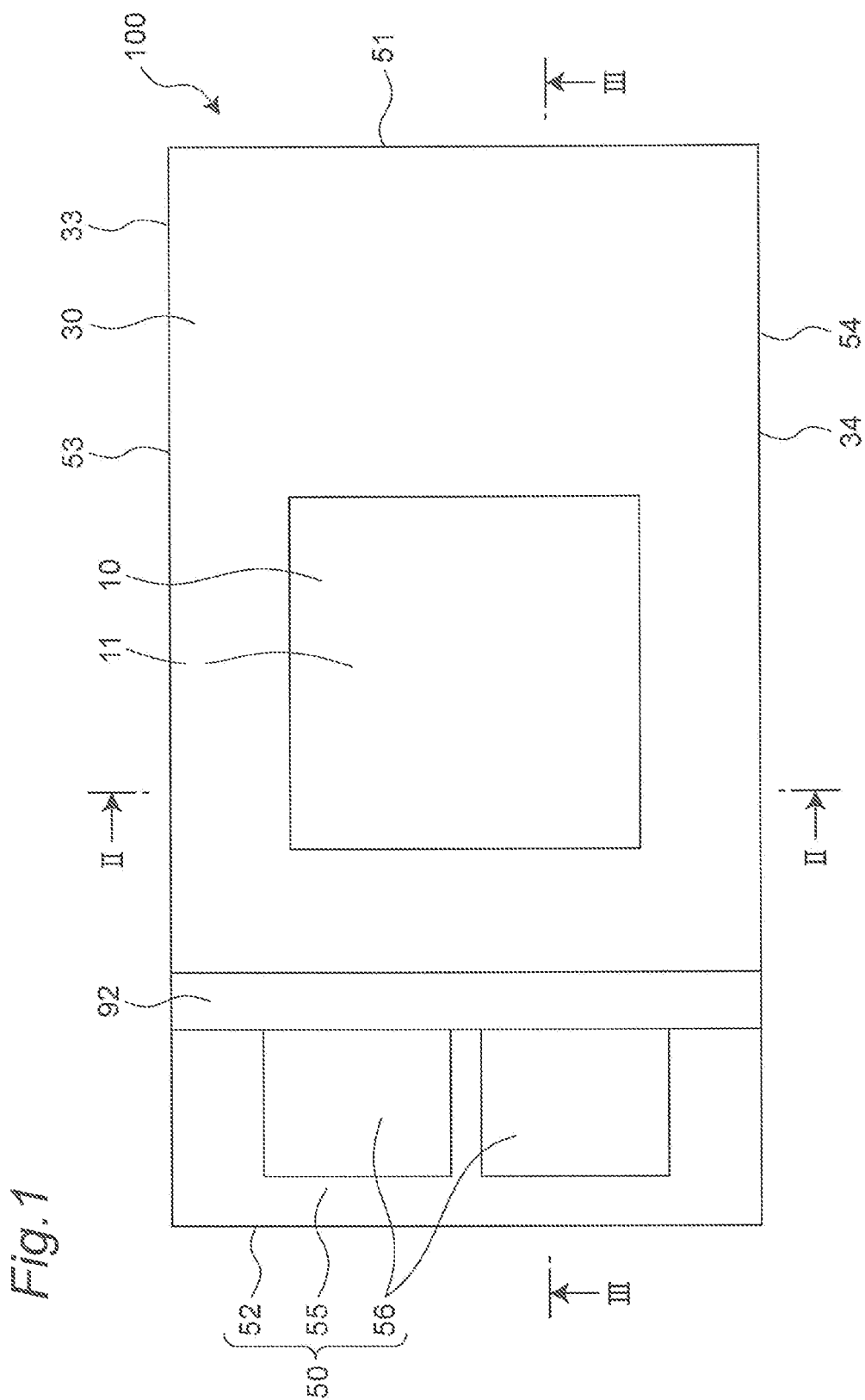
FIG. 1 is a schematic top view of a light emitting device according to a first embodiment of the present disclosure.

Certain embodiments and examples for implementing the present invention will be explained below with reference to the accompanying drawings. The light emitting devices described below are provided for giving shape to the technical ideas of the invention in the present disclosure, and do not limit the invention unless otherwise specifically stated.

In the drawings, the same reference numerals denote members having the same functions. To make the features easily understood, the descriptions of the features are distributed among the embodiments and examples, but the constituent elements described in different embodiments and examples can be replaced or combined in part. The explanation of common features already described in embodiments or examples appearing earlier might be omitted in the subsequent embodiments or examples where the explanation is focused only on the differences. Similar effects attributable to similar features, in particular, will not be mentioned each time an embodiment or example is discussed. The sizes of and positional relationships between the members shown in each drawing might be exaggerated for clarity of explanation.

In the present specification, the lower part of a light emitting device refers to a side on which the substrate 50 is located, and the upper part of the light emitting device refers to a side opposite the lower part. In the present specification, furthermore, the inner side of a light emitting device refers to a center side of the light emitting device, and the outer side of the light emitting device refers to an exterior surface side of the light emitting device.

DETAILED DESCRIPTION

1. First Embodiment

Figure 2:
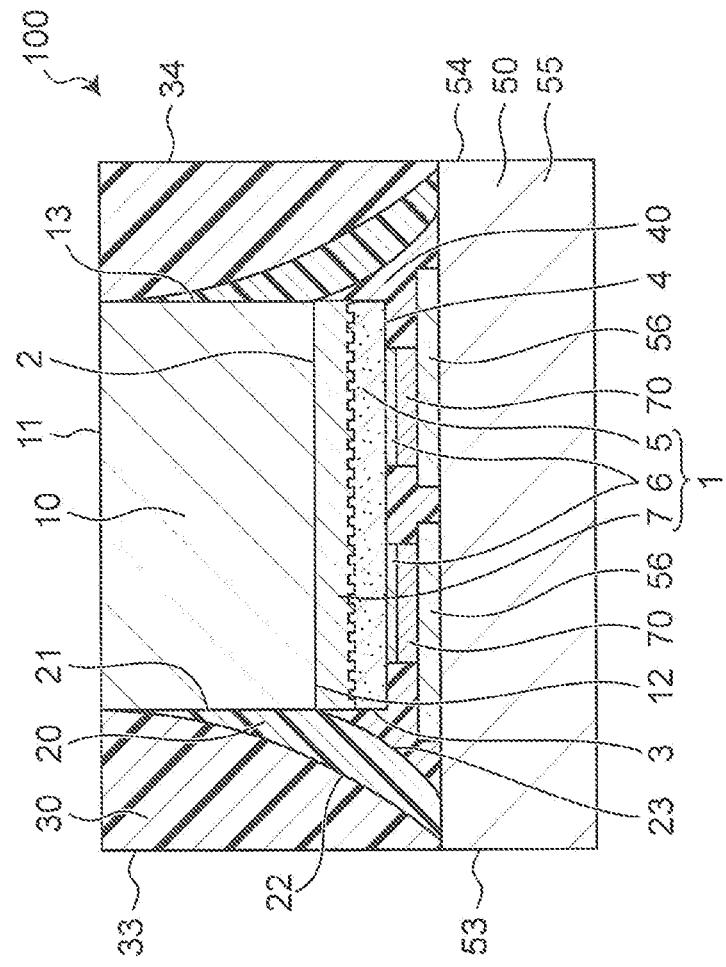
FIG. 2 is a schematic cross-sectional view of the light emitting device taken along line II-II in FIG. 1.
Figure 3:
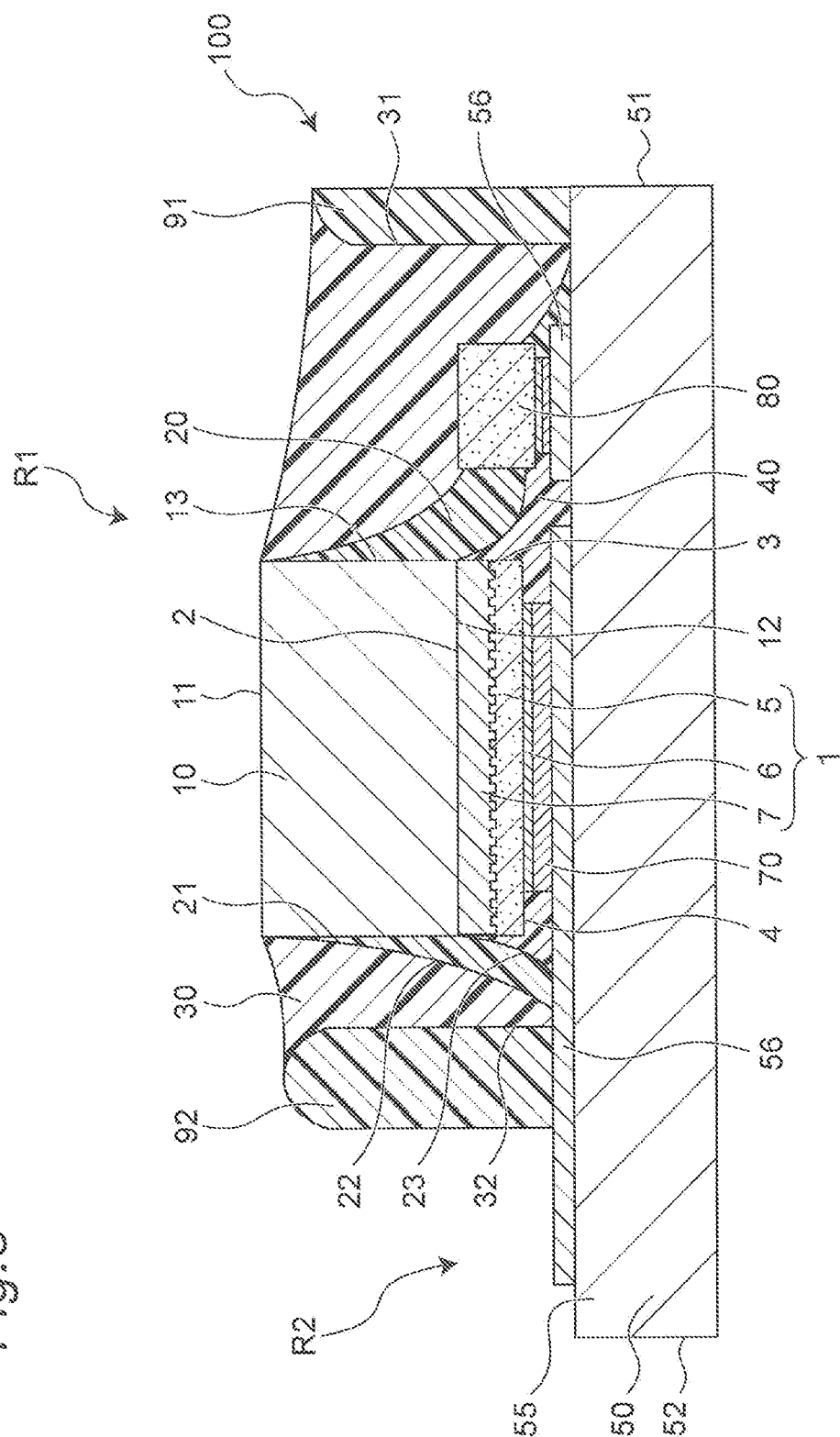
FIG. 3 is a schematic cross-sectional view of the light emitting device taken along line III-III in FIG. 1.

As shown in FIG. 1 to FIG. 3, a light emitting device 100 according to a first embodiment includes a light emitting element 1 that emits first light, a first wavelength conversion member 10 disposed on the light emitting element 1 and having a lower surface 12 bonded to the light emitting element 1, an upper surface 11 opposite the lower surface 12, and lateral surfaces 13 connected to the upper surface 11, the first wavelength conversion member emitting second light when excited by the first light, a second wavelength conversion member 20 covering the lateral surfaces 13 of the first wavelength conversion member 10 without covering the upper surface 11 of the first wavelength conversion member 10 and having oblique surfaces 22 extending from the lateral surfaces 13 to the outer side, and a first light reflecting member 30 covering the oblique surfaces 22. The second wavelength conversion member 20 emits third light when excited by at least one of the first light and the second light.

Furthermore, the light emitting device 100 may include a substrate 50 for mounting the light emitting element 1, and a second light reflecting member 40 disposed between the lateral surfaces 3 of the light emitting element 1 and the second wavelength conversion member 20.

A first protrusion 91 and a second protrusion 91 that retain the first light reflecting member 30 and partly covering the lateral surfaces of the first light reflecting member 30, and a protective device 80 may be disposed on the substrate 50.

Substrate

A substrate 50 is a member on which a light emitting element 1 is mounted, and includes wiring 56 for supplying power to the light emitting element 1 from the outside. As shown in FIG. 1 to FIG. 3, the substrate 50 includes wiring 56 and a base 55. The wiring 56 is disposed on at least on the upper surface of the base 55.

A base 55 has, for example, a rectangular cuboid shape, and includes four lateral surfaces connected to the upper surface on which a light emitting element is mounted. The four lateral surfaces are a first lateral surface 51 and a second lateral surface 52 that oppose one another, a third lateral surface 53 and a fourth lateral surface 54 that oppose one another and connect the first lateral surface 51 and the second lateral surface 52.

For the base 55, a material that hardly transmits the light from the light emitting element or the external light is preferably used. Examples include ceramics, such as aluminum oxide, aluminum nitride, and silicon nitride, resins, such as phenol resins, epoxy resins, polyimide resins, BT resins, and polyphthalamide resins, semiconductors such as silicon, and metals, such as copper and aluminum, which can be used singly or as a composite material. Examples of materials for the wiring 56 include metals, such as iron, copper, nickel, aluminum, gold, silver, platinum, titanium, tungsten, and palladium, and alloys containing at least one of these.

The light emitting device 100 may have a structure in which the light emitting element 1 is mounted at the bottom of a recess provided on the upper surface of the substrate 50. The light emitting device 100 may have a structure without a substrate 50. For example, the light emitting device may have a structure equipped with metal members as the electrodes of the light emitting device that are exposed from the cover member such as the second wavelength conversion member 20 that covers the light emitting element 1.

Wiring 56 is electrically connected to the electrodes 6 of the light emitting element 1. The wiring 56 and the electrodes 6 can be connected via conductive bonding members for example. Examples of the bonding members 70 include eutectic solder, conductive paste, bumps, and the like. The wiring 56 includes anode side wiring 56 and cathode side wiring 56. As shown in FIG. 1 and FIG. 3, a portion of the anode side wiring 56 and a portion of the cathode side wiring 56 are exposed at the surface of the light emitting device 100 to function as the external electrodes of the light emitting device 100.

Light Emitting Element

A light emitting element 1 emits first light.

As shown in FIG. 2 and FIG. 3, the light emitting element 1 includes a semiconductor stack structure 5 and electrodes 6. The light emitting element 1 may include a support substrate 7 that supports the semiconductor stack structure 5.

A semiconductor stack structure 5 includes, for example, a first semiconductor layer, a second semiconductor layer, and a light emitting layer disposed between the first semiconductor layer and the second semiconductor layer.

Various semiconductors can be used for the semiconductor stack structure 5, including group III-V compound semiconductors, group II-VI compound semiconductors, and the like. Specific examples include nitride-based semiconductor materials such as $In_XAl_YGa_{1-X-Y}N$ ($0 \leq X$, $0 \leq Y$, $0 \leq X+Y \leq 1$), and InN, AlN, GaN, InGaN, AlGaN, InGaAlN, or the like can be used. As for the thickness of each layer and the layer structure, any of those known in the art can be utilized. The semiconductor stack structure 5 emits first light from the light emitting layer. The peak wavelength of the first light, for example, is in a range of 260 nm to 630 nm. The first light is, for example, blue light.

A light emitting element 1 may have a single semiconductor stack structure 5 on a single support substrate, or a plurality of semiconductor stack structures 5 on a single support substrate. A semiconductor stack structure 5 may have a single light emitting layer or a plurality of light emitting layers. The structure of a semiconductor stack structure 5 having a plurality of light emitting layers may be one in which a plurality of light emitting layers are interposed between a single first semiconductor later and a single second semiconductor layer, or one in which a structure that includes a first semiconductor layer, a light emitting layer, and a second semiconductor layer layered in order are repeated a plurality of times.

A light emitting element 1 includes electrodes 6 on the semiconductor stack structure 5. The electrodes 6 includes a first electrode connected to the first semiconductor layer and a second electrode connected to the second semiconductor layer. The first electrode and the second electrode may be disposed on different surfaces or the same surface of the semiconductor stack structure 5.

In a light emitting device 100, the shape of the light emitting element 1 when viewed from above is, for example, a square or rectangle. The light emitting element 1 when viewed from above may have another polygonal shape, such as a triangle, hexagon, or the like.

First Wavelength Conversion Member

As shown in FIG. 2 and FIG. 3, a first wavelength conversion member 10 is disposed on the light emitting element 1. The first wavelength conversion member 10 includes a lower surface 12 bonded to the light emitting element 1, an upper surface 11 opposite the lower surface 12, and lateral surfaces 13 connected to the upper surface 11.

The lower surface 12 of the first wavelength conversion member 10 is bonded to the upper surface 2 of the light emitting element 1. The first wavelength conversion member 10 is excited by the first light emitted by the light emitting element 1 to emit second light. The first wavelength conversion member 10 is, for example, a sheet shaped member. The upper surface 11 and the lower surface 12 are flat surfaces that are parallel to one another, and the upper surface 11 is, as shown in FIG. 1, quadrangular.

The lower surface 12, as shown in FIG. 2 and FIG. 3, entirely covers the upper surface 2 of the light emitting element 1.

The lateral surfaces 13 include a plurality of lateral surfaces. Specifically, there are four lateral surfaces respectively connected to the sides of the quadrangular upper surface 11. Here, the four lateral surfaces are all flat surfaces perpendicular to the upper surface 11.

The shape of the first wavelength conversion member 10 described above is merely an example. In the first wavelength conversion member 10, for example, the upper surface 11 and the lower surface 12 may be flat surfaces that have areas of the same size. Alternatively, one of the upper surface 11 and the lower surface 12 may enclose the other in a plan view. In this case, it may have a structure in which there is a step between the upper surface 11 and the lower surface 12, or the lateral surfaces include oblique surfaces extending from the upper surface to the lower surface.

The first wavelength conversion member 10 can be bonded to the upper surface 2 of the light emitting element 1 via a light transmissive bonding material. The first wavelength conversion member 10 and the light emitting element 1 may alternatively be bonded directly without any bonding material. The upper surface 11 of the first wavelength conversion member 10 is exposed from the first light reflecting member 30 (described later) to be a part of the upper surface of the light emitting device 100. In this case, the upper surface 11 of the first wavelength conversion member 10 serves as the emission surface of the light emitting device 100.

The first wavelength conversion member 10 contains a phosphor that is excited by the first light emitted by the light emitting element 1 to emit second light. The second light has a longer peak wavelength than the peak wavelength of the first light. The peak wavelength of the second light is in a range of 520 nm to 560 nm, for example. The second light is, for example, yellow green to yellow light.

Examples of the first wavelength conversion member 10 include a sintered body of a phosphor, and one made of a resin or an inorganic material, such as glass or ceramic, which contains phosphor powder. Alternatively, the first wavelength conversion member 10 may be one in which a layer containing a phosphor is applied on the surface of a formed body made of a resin, glass, ceramic, or the like. Furthermore, the first wavelength conversion member 10 may contain a filler, such as a diffuser, or the like, to the extend that such a filler does not shield light. For the diffuser, for example, titanium oxide, silicon oxide, aluminum oxide, zinc oxide, or the like can be used. In the case of using a resin as a binder for the phosphor and/or the diffuser, for example, epoxy resins, modified epoxy resins, silicone resins, modified silicone resins, acrylic resins, fluorine resins, or the like can be used as the resin.

The first wavelength conversion member has light transmissivity, and the transmissivity is preferably 50% or higher, more preferably 70% or higher with respect to the first light from the light emitting element 1, and the wavelength converted second light and third light.

For the phosphor to be contained in the first wavelength conversion member 10, one that can be excited by the first light emitted by the light emitting element 1 is used.

Examples of green light emitting phosphors include yttrium aluminum garnet based phosphors (e.g., $Y_3(Al,Ga)_5O_{12}$:Ce), lutetium aluminum garnet based phosphors (e.g., $Lu_3(Al,Ga)_5O_{12}$:Ce), terbium aluminum garnet based phosphors (e.g., $Tb_3(Al,Ga)_5O_{12}$:Ce), silicate based phosphors (e.g., $(Ba,Sr)_2SiO_4$:Eu), chlorosilicate based phosphors (e.g., $CasMg(SiO_4)_4C_{12}$:Eu), β-SiAlON based phosphors (e.g., $Si_{6-z}Al_zO_zN_{8-z}$:Eu (0<z<4.2)), and SGS-based phosphors (e.g., $SrGa_2S_4$:Eu).

Examples of yellow light emitting phosphors include α-SiAlON based phosphors (e.g., $M_z(Si,Al)_{12}(O,N)_{16}$:Eu (0<z≤2, "M" is Li, Mg, Ca, Y, and lanthanide elements excluding La and Ce). In addition, some of the green light emitting phosphors listed above emit yellow light. Furthermore, for example, the peak emission wavelengths of yttrium aluminum garnet phosphors can be shifted to longer wavelengths by replacing a portion of Y with Gd to emit yellow light. Moreover, some of these wavelength conversion substances can emit orange light.

Examples of red light emitting phosphors include nitrogen-containing calcium aluminosilicate (CASN or SCASN) based phosphors (e.g., $(Sr,Ca)AlSiN_3$:Eu) and B SESN-based phosphors (e.g., $(Ba,Sr,Ca)_2Si_5N_8$:Eu). Additional examples include manganese-activated fluoride phosphors (represented by the general formula (I), $A_2[M_{1-a}Mn_aF_6]$ (in the general formula (I): "A" is at least one selected from the group consisting of K, Li, Na, Rb, Cs, and $NH_4$; "M" is at least one selected from the group consisting of Group 4 elements and Group 14 elements; and "a" satisfies 0<a<0.2)). Examples of the manganese-activated fluoride phosphors include KSF-based phosphors (e.g., $K_2SiF_6$:Mn), KSAF-based phosphors (e.g., $K_2Si_{0.99}Al_{0.01}F_{5.99}$:Mn), and MGF-based phosphors (e.g., $3.5MgO·0.5MgF_2·GeO_2$:Mn).

KSAF-based phosphors may have a composition represented by the formula (I) below:

$$M_2[Si_pAl_qMn_rF_s] \qquad (I)$$

In the formula (I), "M" represents an alkali metal, and may include at least K. Mn can be tetravalent Mn ions. p, q, r, and s can satisfy 0.9≤p+q+r≤1.1, 0<q≤0.1, 0<r≤0.2, and 5.9≤s≤6.1, preferably, 0.95≤p+q+r≤1.05 or 0.97≤p+q+r≤1.03, 0<q≤0.03, 0.002≤q≤0.02 or 0.003≤q≤0.015, 0.005≤r≤0.15, 0.01≤r≤0.12 or 0.015≤r≤0.1, 5.92≤s≤6.05 or 5.95≤s≤6.025.

Examples of such a composition include the compositions represented by $K_2[Si_{0.946}Al_{0.005}Mn_{0.049}F_{5.995}]$, $K_2[Si_{0.942}Al_{0.008}Mn_{0.050}F_{5.992}]$ and $K_2[Si_{0.939}Al_{0.014}Mn_{0.047}F_{5.986}]$. Such KSAF-based phosphors can emit high luminance red light having a peak emission wavelength with a narrow full width at half maximum.

Among these, for the phosphor to be contained in the first wavelength conversion member as a yellow light emitting phosphor, yttrium aluminum garnet based phosphors (e.g., $Y_3(Al,Ga)_5O_{12}$:Ce) in which a portion of Y is replaced with Gd can be preferably used. This allows the light emitting device 100 to output, as the light emitted from the first wavelength conversion member, white light that is a mixture of blue light as the first light and yellow light as the second light.

Second Wavelength Conversion Member

A second wavelength conversion member 20 exposes the upper surface 11 of the first wavelength conversion member 10 while covering the lateral surfaces 13 of the first wavelength conversion member 10. The second wavelength conversion member 20 has oblique surfaces extending from the lateral surfaces 13 of the first wavelength conversion member 10 to the outer side (hereinafter referred to as the first oblique surfaces 22). The second wavelength conversion member 20 is excited by at least one of the first light and the second light to emit third light.

The second wavelength conversion member 20 is excited by at least one of the first light emitted by the light emitting element 1 and the second light emitted by the first wavelength conversion member 10 to emit third light. The third light has a longer peak wavelength than the peak wavelength of the first light. Here, the third light has a longer peak wavelength than the peak wavelength of the first light and the peak wavelength of the second. The peak wavelength of the third light is, for example, 600 nm to 660 nm. The third light, for example, is orange to red light.

As shown in FIG. 2 and FIG. 3, the second wavelength conversion member 20 has first surfaces 21 in contact with the lateral surfaces of the first wavelength conversion member 10, and first oblique surfaces 22 extending from the upper edges of the first surfaces 21 to the outer side. The second wavelength conversion member 20 may further include second oblique surfaces 23 extending from the lower edges of the first surfaces 21 to the outer side.

In the case where the first wavelength conversion member 10 includes a plurality of lateral surfaces, the second wavelength conversion member 20 continuously covers the a plurality of lateral surfaces of the first wavelength conversion member 10. In the light emitting device 100, the second wavelength conversion member 20 preferably covers the four lateral surfaces of the first wavelength conversion member 10 continuously, more preferably entirely covers the lateral surfaces 13 of the first wavelength conversion member 10. In the case in which the light emitting device 100 includes the second light reflecting member 40 described later, the second wavelength conversion member 20 may cover at least a portion of the upper region of each lateral surface 3 of the light emitting element 1 exposed from the second light reflecting member 40. In the case in which the light emitting device 100 does not include the second light reflecting member 40 described later, the second wavelength conversion member 20 preferably extends from the lateral surfaces of the first wavelength conversion member 10 to the lateral surfaces 3 of the light emitting element 1 to entirely cover the lateral surfaces of the light emitting element 1.

The first oblique surfaces 22 are connected to the first surfaces 21. The upper edges of the first oblique surfaces 22 are in contact with the lateral surfaces of the first wavelength conversion member 10 and the lower edges are in contact with, for example, the upper surface of the substrate 50.

The second oblique surfaces 23 are positioned inward of the first oblique surfaces 22, contacting the upper edges with the lateral surfaces of the first wavelength conversion member 10 or the lateral surfaces of the light emitting element 1, and the lower edges with, for example, the upper surface of the substrate 50.

The first oblique surfaces 22 and the second oblique surfaces 23 may be flat surfaces or curved surfaces. In particular, as shown in FIG. 2 and FIG. 3, the first oblique surfaces 22 are preferably curved surfaces such that their cross-sectional shapes are curved lines protruding from the outer side to the inner side of the light emitting device. In the example herein, the first oblique surfaces 22 are curved surfaces where the curved lines in a cross section protrude towards the light emitting element 1. With such a shape, the second wavelength conversion member 20 can reflect the light incident thereon to allow the reflected light to advance towards the first wavelength conversion member 10. In other words, such a structure allows for guiding a greater amount of light towards the first wavelength conversion member 10, thereby increasing the light extraction efficiency of the light emitting device 100.

The first oblique surfaces 22 are preferably covered entirely by the first light reflecting member 30 (described later). The light reflecting function of the first light reflecting member 30 can guide a greater amount of light towards the first wavelength conversion member 10, thereby increasing the light extraction efficiency of the light emitting device 100.

The upper edges of the first oblique surfaces 22 may meet the upper edges of the lateral surfaces 13 of the first wavelength conversion member 10 (i.e., the outer edges of the upper surface 11 of the first wavelength conversion member 10) or meet the lateral surfaces 13 of the first wavelength conversion member 10 at lower positions than the upper edges.

In the case in which the upper edges of the first oblique surfaces 22 meet the upper edges of the lateral surfaces 13 of the first wavelength conversion member 10 (i.e., the second wavelength conversion member 20 is a part of the upper surface of the light emitting device 100), the thickness of the second conversion member 20 exposed at the upper surface of the light emitting device 100 is preferably small. For example, the thickness is preferably 10 μm or smaller. This can reduce the amount of light exiting the second wavelength conversion member 20 without going through the first wavelength conversion member 10, thereby reducing the unevenness in emission color in the light emitting device 100.

Figure 7:
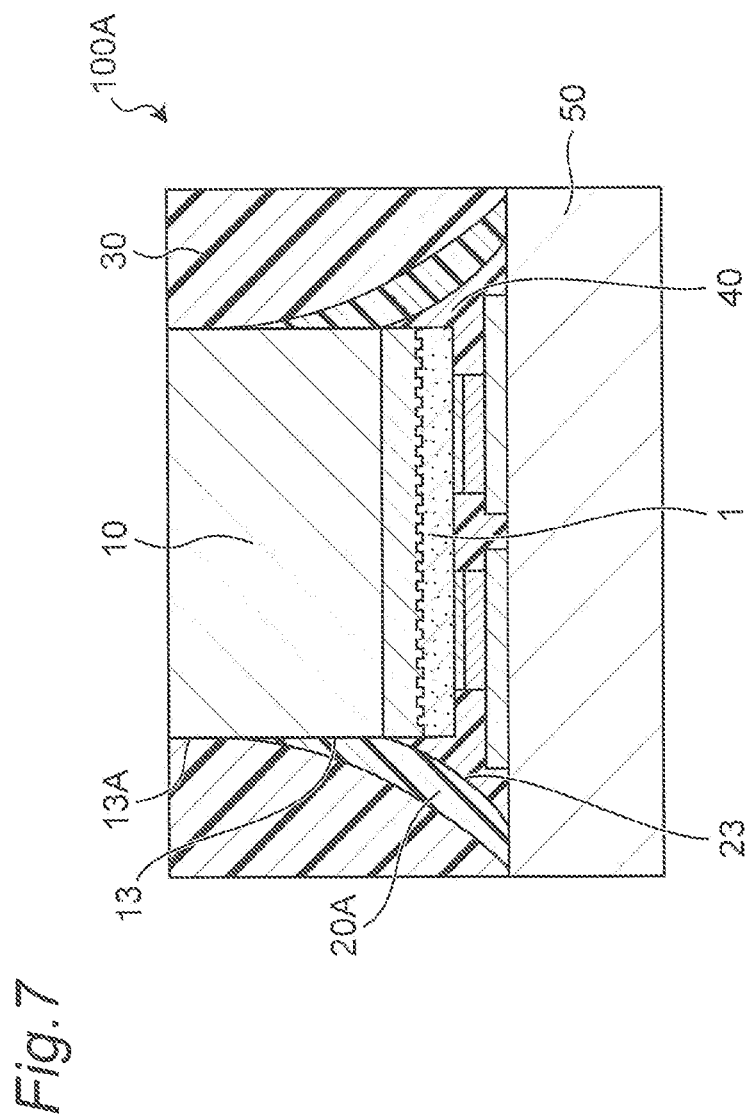
FIG. 7 is a schematic cross-sectional view of a light emitting device according to an embodiment of the present disclosure.

In the case in which the upper edges of the first oblique surfaces 22 meet the lateral surfaces 13 of the first wavelength conversion member 10 at lower positions than the upper edges of the lateral surfaces 13 (i.e., such as in the case of the light emitting device 100A shown in FIG. 7 where the second wavelength conversion member 20A exposes the upper portions 13A of the lateral surfaces 13 of the first wavelength conversion member 10), the upper portions 13A of the lateral surfaces 13 of the first wavelength conversion member 10 exposed from the second wavelength conversion member 20A in the light emitting device 100A are preferably covered by the first light reflecting member 30. With this structure, light emitted from the second wavelength conversion member 20 is externally less visible through the first light reflecting member 30, so that unevenness in emission color of the light emitting device 100 can be reduced An example of the second wavelength conversion member 20 is a resin containing a light reflecting substance and a phosphor. Specifically, a resin base material containing a light reflecting substance and a phosphor can be used. By containing a light reflecting substance, the second wavelength conversion member 20 can efficiently reflect the first light and the second light. Furthermore, by containing a phosphor, the second wavelength conversion member 20 can convert the passing light not reflected by the light reflecting substance into third light to be reflected by the first oblique surfaces 22 and/or the second oblique surfaces 23 to advance towards the first wavelength conversion member. The inclusion of the third light in the light exiting the light emitting device 100 makes it possible to adjust the chromaticity of the light output by the light emitting device 100.

For the light reflecting substance to be contained in the second wavelength conversion member 20, titanium oxide, aluminum oxide, silicon oxide, zinc oxide, barium carbonate, barium sulfate, boron nitride, aluminum nitride, glass filler, or the like can be suitably used.

For the resin for the base material, a similar resin to any of those listed as examples with reference to the first wavelength conversion member 10 can be used.

For the phosphor to be contained in the second wavelength conversion member 20, one that can be excited by at least one of the first light emitted by the light emitting element 1 and the second light emitted by the first wavelength conversion member 10 is used. For the phosphor, one similar to any of those listed as examples earlier can be used.

Among these, a BSESN phosphor (e.g., $(Ba,Sr,Ca)_2Si_5N_8$:Eu) can be suitably used as an orange light emitting phosphor to be contained in the second wavelength conversion member 20.

With the second wavelength conversion member 20 containing such an orange light emitting phosphor, the chromaticity of the white light resulting from mixing blue light and yellow light output by the light emitting device 100 can be shifted towards orange.

The same phosphor as that contained in the first wavelength conversion member 10 may be used as the phosphor contained in the second wavelength conversion member 20. The chromaticity of the light output by the light emitting device 100 can be adjusted in this case as well.

First Light Reflecting Member

A first light reflecting member 30 covers the first oblique surfaces 22 of the second wavelength conversion member 20. The first light reflecting member 30 exposes the upper surface 11 of the first wavelength conversion member 10. In the upper surface of the light emitting device 100, the first light reflecting member 30 is preferably disposed continuously with the upper surface 11 of the first wavelength conversion member 10. The upper surface of the first light reflecting member 30 is a part of the upper surface of the light emitting device 100.

As shown in FIG. 1, the outline of the first light reflecting member 30 when viewed from above is, for example, substantially quadrangular, and the first light reflecting member 30 includes, for example, four lateral surfaces that are connected to the upper surface. Two opposite lateral surfaces 33 and 34 of the first light reflecting member 30 are parts of the lateral surfaces of the light emitting device 100. As shown in FIG. 2, the lateral surface 33 of the two lateral surfaces 33 and 34 is substantially coplanar with the third lateral surface 53 of the substrate 50. The lateral surface 34 of the two lateral surfaces 33 and 34 is substantially coplanar with the fourth lateral surface 54 of the substrate 50. The other opposite lateral surfaces 31 and 32 of the first light reflecting member 30 are, as shown in FIG. 3, covered by the protrusions (the first protrusion 91 or the second protrusion 92). The light emitting device 100 does not have to include a first protrusion 91, and in this case, the first light reflecting member 30 has a lateral surface that is substantially coplanar with the first lateral surface 51 of the substrate 50.

For the first light reflecting member 30, for example, a resin containing a light reflecting substance can be used. For the light reflecting substance, one similar to any of those listed as examples with reference to the second wavelength conversion member 20 can be used. For the resin, a resin similar to any of those listed with reference to the first wavelength conversion member 10 can be used. The first light reflecting member 30 may contain a light absorbing substance, such as carbon black, graphite, or the like.

The first light reflecting member 30 preferably has a reflectivity of 60% or higher, more preferably 80% or higher with respect to the light emitted by the light emitting element 1.

Second Light Reflecting Member

A light emitting device 100 can include a second light reflecting member 40 disposed between the lateral surfaces of the light emitting element 1 and the second wavelength conversion member 20. The second light reflecting member 40 preferably covers the lateral surfaces 3 of the light emitting element 1. This allows the second light reflecting member to reflect the light exiting the lateral surfaces 3 of the light emitting element 1 to advance towards the light emitting element 1. In the case in which the light emitting element 1 is mounted on a substrate 50, the second light reflecting member 40 preferably fills the space between the lower surface 4 of the light emitting element 1 and the upper surface of the substrate 50, covering the lateral surfaces of the electrodes 6 of the light emitting element 1. This allows the second light reflecting member to reflect the light from the light emitting element 1 heading downwards to advance towards the light emitting element 1. If the lateral surfaces of the light emitting element 1 are covered by a light transmissive bonding material, such as in the case where the light emitting element 1 and the first wavelength conversion member 10 are bonded via a light transmissive bonding material, the second light reflecting member 40 can cover the lateral surfaces 3 of the light emitting element 1 via the light transmissive material.

The second light reflecting member 40 is preferably applied to form fillets on the lateral surfaces 3 of the light emitting element 1. This allows the second wavelength conversion member 20 covering the second light reflecting member 40 to have second oblique surfaces 23 in contact with the second light reflecting member 40. The second oblique surfaces 23 are preferably curved surfaces such that their cross-sectional shapes are curved lines protruding from the outer side to the inner side of the light emitting device. This allows a greater portion of the light exiting the lateral surfaces of the light emitting element 1 to be reflected towards the light emitting element 1. The light that becomes incident on the second wavelength conversion member 20 without being reflected by the second oblique surfaces 23 is reflected by the first oblique surfaces 22 and thereby guided towards the first wavelength conversion member 10 to be a part of the light output by the light emitting device 100. This can increase the light extraction efficiency of the light emitting device 100.

For the second light reflecting member 40, materials can be selected from the same materials that constitute the first light reflecting member 30. The materials that constitute the first light reflecting member 30 and the materials that constitute the second light reflecting member 40 may be the same or different.

Protrusions

As shown in FIG. 3, a light emitting device 100 can include protrusions that retain the first light reflecting member. The protrusions include a first protrusion 91 that covers a lateral surface of the first light reflecting member 30 and a second protrusion 92 that cover the opposite lateral surface of the first light reflecting member. The first protrusion 91 is disposed on the upper surface of the substrate 50 along the outer edge on the first lateral surface 51 side. The second protrusion 92 is disposed on the upper surface of the substrate on the second lateral surface 52 side. In the region between the first protrusion 91 and the second protrusion 92, a light emitting element 1, a first wavelength conversion member a second light reflecting member 40, a second wavelength conversion member 20, a first light reflecting member 30, and a protective device 80 are disposed. The regions where the first protrusion 91 and the second protrusion 92 are disposed and the region between the first protrusion 91 and the second protrusion 92 will be collectively referred to as the mounting region R1 below. The wiring 56 is partly exposed in the region of the substrate 50 outward from the second protrusion 92 on the second lateral surface 52 side. This region will be referred to as the external connection region R2 below.

For the first protrusion 91 and the second protrusion 92, for example, a resin can be used. For the resin, any of those described above can be used. The resin for forming the protrusions may be a light transmissive resin, a white resin containing a light reflecting substance, or a gray or black resin containing a light absorbing substance.

Protective Device

A light emitting device 100 may further include a protective device 80. The protective device 80 is connected to the wiring 56 of the substrate 50 via a bonding member such as a bump. The surfaces of the protective device 80 are covered by one or more members among the first light reflecting member 30, the second wavelength conversion member 20, and the second light reflecting member 40. The protective device 80 is, for example, a Zener diode.

Propagation of Light

The propagation of light in a light emitting device 100 will be explained with reference to FIG. 4.

The first light exiting the upper surface 2 of the light emitting element 1 (e.g., arrow A1) becomes incident on the first wavelength conversion member 10. A portion of the first light exiting the lateral surfaces 3 and the lower surface 4 (e.g., arrow A2) is reflected by the lateral surfaces 3 and the lower surface 4 to exit the upper surface 2 of the light emitting element 1 (e.g., arrow A3) and become incident on the first wavelength conversion member 10. A portion of the light incident on the first wavelength conversion member 10 (e.g., arrow B5) exits the upper surface of the first wavelength conversion member 10 (e.g., arrow C1).

A portion of the light exiting the lateral surfaces 13 of the first wavelength conversion member 10 (e.g., arrow B1) is reflected by the first surfaces 21 and/or the second wavelength conversion member 20 (e.g., arrow B4) to exit the upper surface of the first wavelength conversion member 10 (e.g., arrow C4). Another portion becomes incident on the second wavelength conversion member 20 (e.g., D1).

A portion of the first light and/or the second light that became incident on the second wavelength conversion member 20 is converted into third light in the second wavelength conversion member 20. Another portion of the first light and/or the second light incident on the second wavelength conversion member 20 exits the second wavelength conversion member without being converted into third light. In this manner, the light exiting the second wavelength conversion member 20 can include the first light, the second light and the third light.

A portion of the light exiting the second wavelength conversion member 20 (e.g., arrow D1) is reflected by the first oblique surfaces 22 and/or the first light reflecting member 30. A portion of the light reflected by the first oblique surfaces 22 and/or the first light reflecting member 30 (e.g., arrow D2) passes through the first surfaces 21 to enter the first wavelength conversion member 10 (e.g., arrow B2) before exiting the upper surface of the first wavelength conversion member 10 (e.g., arrow C2). In this manner, the light exiting the upper surface of the first wavelength conversion member 10 can include the first light, the second light, and the third light. The light exiting the upper surface of the first wavelength conversion member 10 constitutes the light output by the light emitting device 100.

The light output by the light emitting device 100 constructed as above includes the light that passes through the members as described above. In this manner, the light emitting device 100 can emit light that is a mixture of the first light, the second light, and the third light. In the case in which the first light is blue light, the second light includes yellow green to yellow light, and the third light includes orange to red light, in particular, adjusting the type and the amount of the phosphor to be contained in the second wavelength conversion member in the light emitting device 100 allows the chromaticity of the white light composed of the first light and the second light to be shifted towards red. In other words, the light emitting device 100 equipped with a second wavelength conversion member 20 allows for the adjustment of the chromaticity of the light output by the light emitting device 100.

Furthermore, the light output by the light emitting device 100 can be substantially free of the first light. In the case of obtaining a light emitting device that emits orange to red light by using a blue light emitting element, for example, substantially all light output by the light emitting device 100 may be composed of the second light and the third light. Providing the light emitting device with a second wavelength conversion member can adjust the chromaticity of the light output by the light emitting device in this case as well. Furthermore, the leakage of the first light from the lateral surfaces of the light emitting device via the first light reflecting member can be reduced.

Moreover, in the case of providing a light emitting device 100 with a second light reflecting member, a portion of the light exiting the lateral surfaces 3 and the lower surface 4 of the light emitting element 1 that transmits through the second light reflecting member 40 without being reflected by the lateral surfaces 3 and the lower surface 4 of the light emitting element 1 or the second light reflecting member 40 (e.g., arrow E1) becomes incident on the second wavelength conversion member 20 (e.g., arrow D3). A portion of the light incident on the second wavelength conversion member 20 is converted into third light in the second wavelength conversion member 20.

As described above, the light that exits the second wavelength conversion member includes the first light that became incident on the second wavelength conversion member via the second light reflecting member 40 and the third light attributed to the first light. A portion of the light that passes through the second wavelength conversion member 20 (e.g., arrow D3) is reflected by the first oblique surfaces 22 and/or the first light reflecting member (e.g., arrow D4) before entering the first wavelength conversion member 10 through the first surfaces 21 (e.g., arrow B3) and exiting the upper surface of the first wavelength conversion member 10 (e.g., arrow C3). Accordingly, the light that becomes incident on the second wavelength conversion member 20 via the second light reflecting member 40 can also be a part of the light output by the light emitting device 100. In other words, the light emitting device 100 constructed as above can output the light attributed to the first light that passed through the second light reflecting member 40. This, as a result, can increase the light extraction efficiency of the light emitting device 100.

Figure 4:
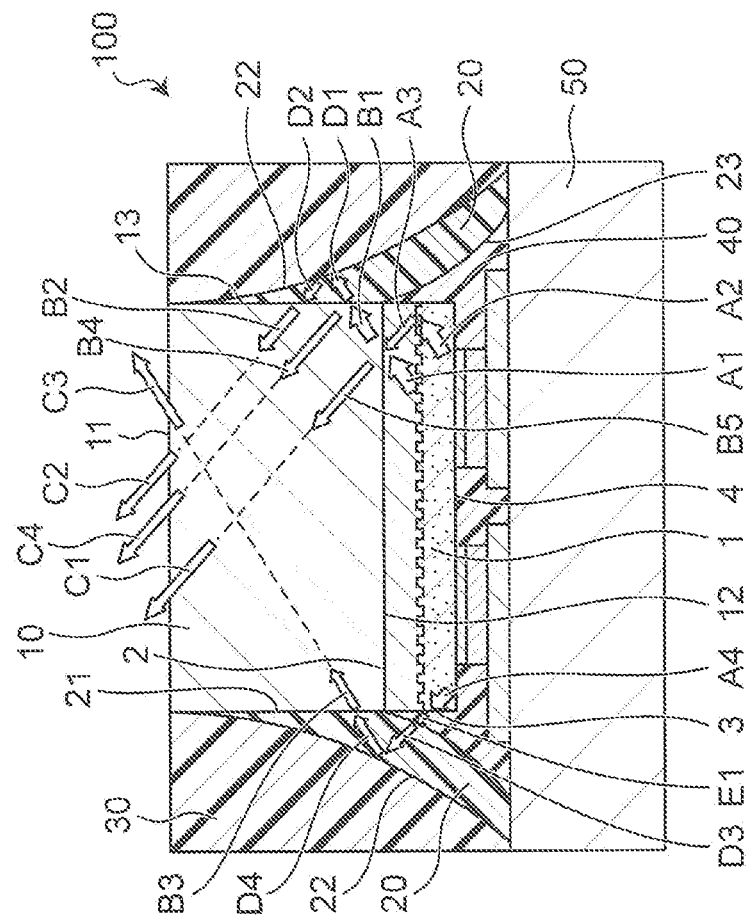
FIG. 4 is a schematic diagram showing the propagation of light in the light emitting device shown in FIG. 1.

The arrows shown in FIG. 4 are schematic representation provided for explaining the propagation of light in a simplified manner. The actual propagation of light changes as the light passes through each member or between members depending on the refractive index differences and the scattering effect of the materials contained in the members.

The amount of the third light contained in the light exiting the emission surface can be adjusted by suitably changing the shapes of the first oblique surfaces 22 and the second oblique surfaces 23, the volume of the second wavelength conversion member 20 and the amount of a phosphor contained therein. In other words, the color of light output by the light emitting device 100 can be suitably adjusted.

2. Manufacturing Method

A method of manufacturing a light emitting device 100 includes:
(1) a step of preparing a collective substrate;
(2) a step of disposing protrusions;
(3) a step of disposing light emitting elements;
(4) a step of disposing first wavelength conversion members;
(5) a step of disposing protective devices;
(6) a step of disposing second light reflecting members;
(7) a step of disposing second wavelength conversion members;
(8) a step of disposing first light reflecting members; and
(9) a step of separating the block substrate into individual devices.

Each step will be explained below with reference to FIG. 5A to FIG. 5H.

(1) Step of Preparing Collective Substrate

Figure 5B:
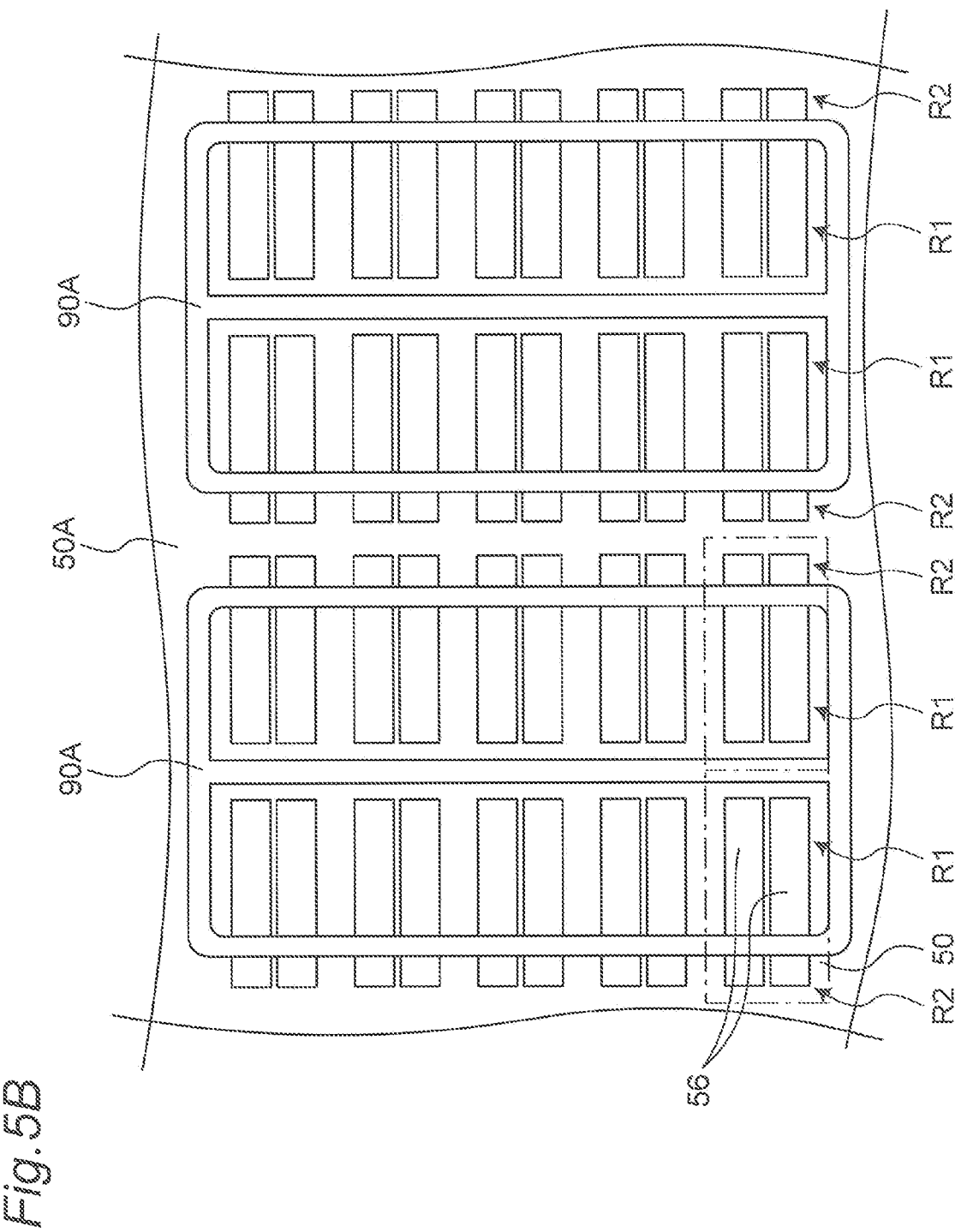
FIG. 5B is a schematic top view showing a step in the method of manufacturing a light emitting device according to the first embodiment.

In a step of preparing a collective substrate, as shown in FIG. 5A, a collective substrate 50A that includes a plurality of substrate 50 regions is prepared. The substrates as shown in FIG. 5B, are arranged in a matrix, for example. The collective substrate includes wiring 56 having a predetermined pattern layout per light emitting device 100 area. The dash-dotted lines in FIG. 5A and FIG. 5B are imaginary lines provided to make the borders of the substrates 50 for the light emitting devices 100 to be manufactured more easily understood. In FIG. 5B, the wiring 56 is represented by using a simplified shape to make the drawing more easily understood.

The wiring 56 can be laid out by a known method such as plating, vapor deposition, sputtering, or the like.

The collective substrate 50A may be prepared through a purchase or transfer of one that is already provided with wiring 56.

(2) Step of Disposing Protrusions

In a step of disposing protrusions, frame shaped protrusions 90A are disposed on the upper surface of the block substrate 50A. As shown in FIG. 5B, each protrusion 90A collectively encloses the mounting regions R1 of a plurality of light emitting devices 100 to be manufactured so as to separate the mounting regions R1 and the external connection regions R2 of the light emitting devices 100. Disposing the protrusions 90A in this manner can make it easier to dispose second light reflecting members 40, second wavelength conversion members 20, and first light reflecting members 30 only in the areas surrounded by the protrusions 90A in the subsequent steps.

(3) Step of Disposing Light Emitting Elements

Figure 5C:
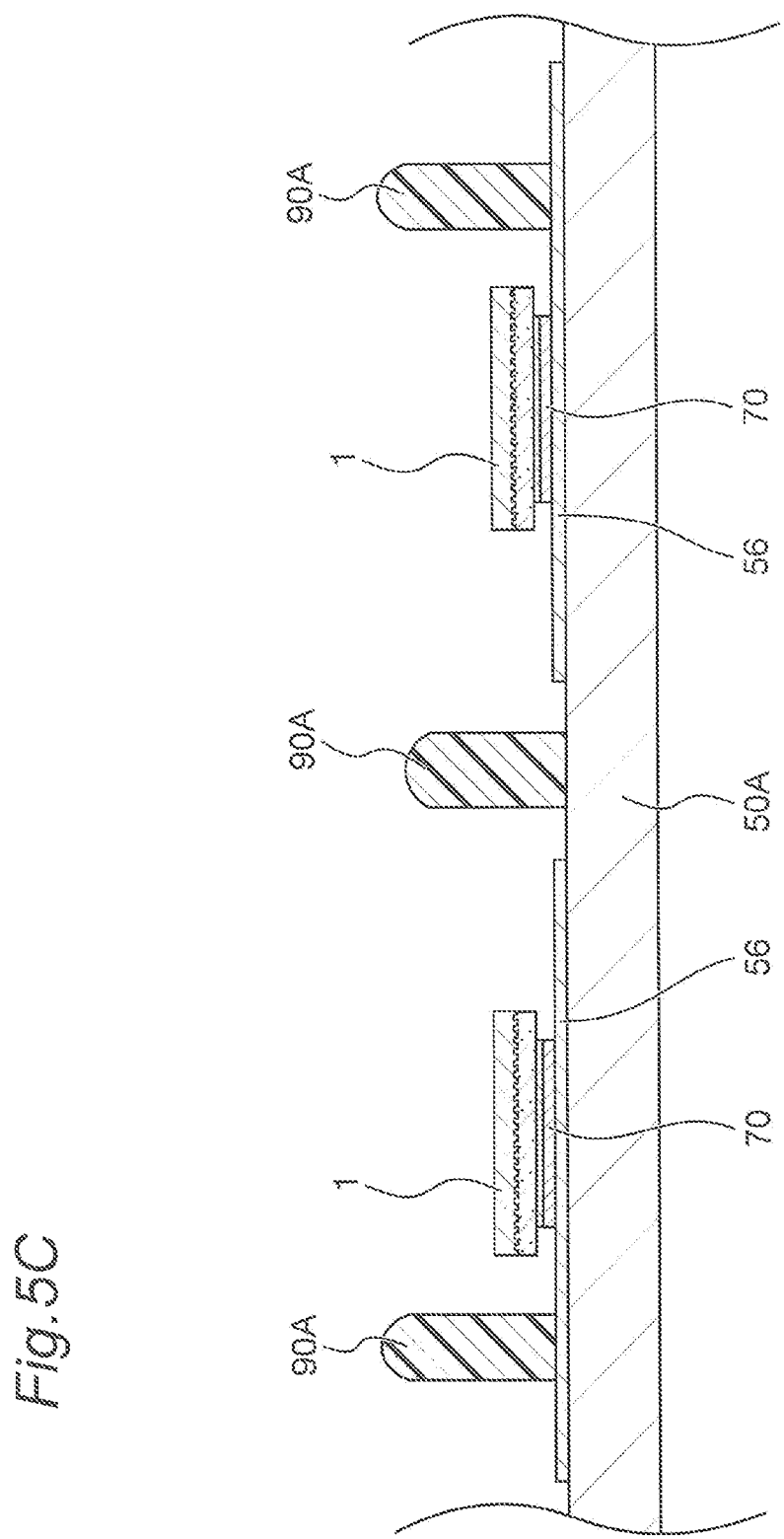
FIG. 5C is a schematic cross-sectional view showing a step in the method of manufacturing a light emitting device according to the first embodiment.

In a step of disposing light emitting elements, as shown in FIG. 5C, light emitting elements 1 are disposed on the wiring 56 surrounded by the protrusions 90A. The light emitting elements 1 are disposed via bumps, for example.

(4) Step of Disposing First Wavelength Conversion Members

In a step of disposing first wavelength conversion members, as shown in FIG. 5D, first wavelength conversion members 10 are disposed on the upper surfaces 2 of the light emitting elements 1. The first wavelength conversion members 10 are bonded to the light emitting elements 1 by using, for example, a light transmissive adhesive.

The step of disposing first wavelength conversion members may be conducted before the step of disposing light emitting elements.

In this case, in the step of disposing light emitting elements, light emitting elements 1 that already have first wavelength conversion members thereon are disposed on the wiring 56.

(5) Step of Disposing Protective Devices

In a step of disposing protective devices, as shown in FIG. 5E, protective devices 80 are disposed on the wiring 56 surrounded by the protrusions 90A. The protective devices 80 are disposed via bumps, for example.

(6) Step of Disposing Second Light Reflecting Members

Figure 5F:
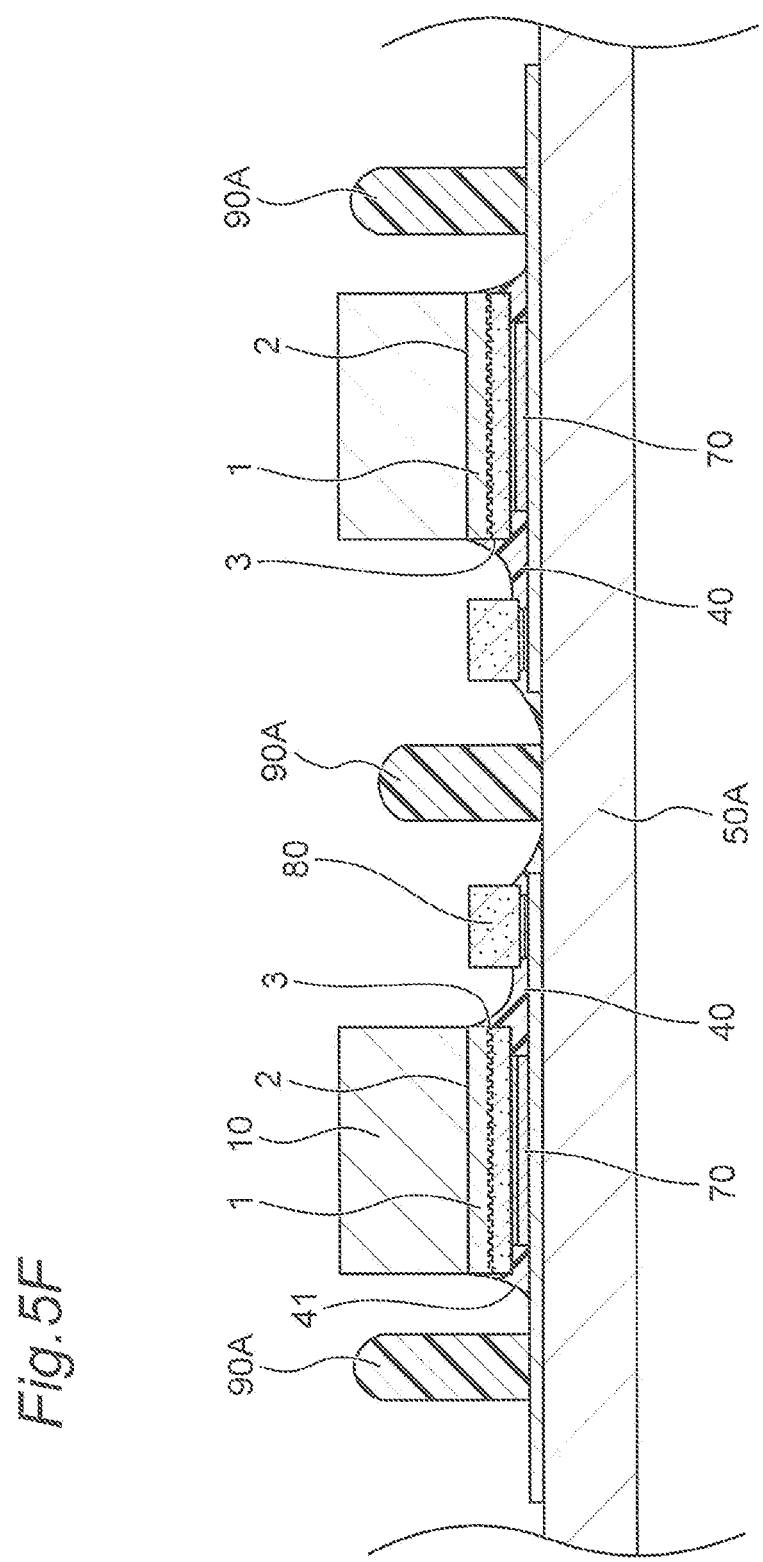
FIG. 5F is a schematic cross-sectional view showing a step in the method of manufacturing a light emitting device according to the first embodiment.
Figure 5G:
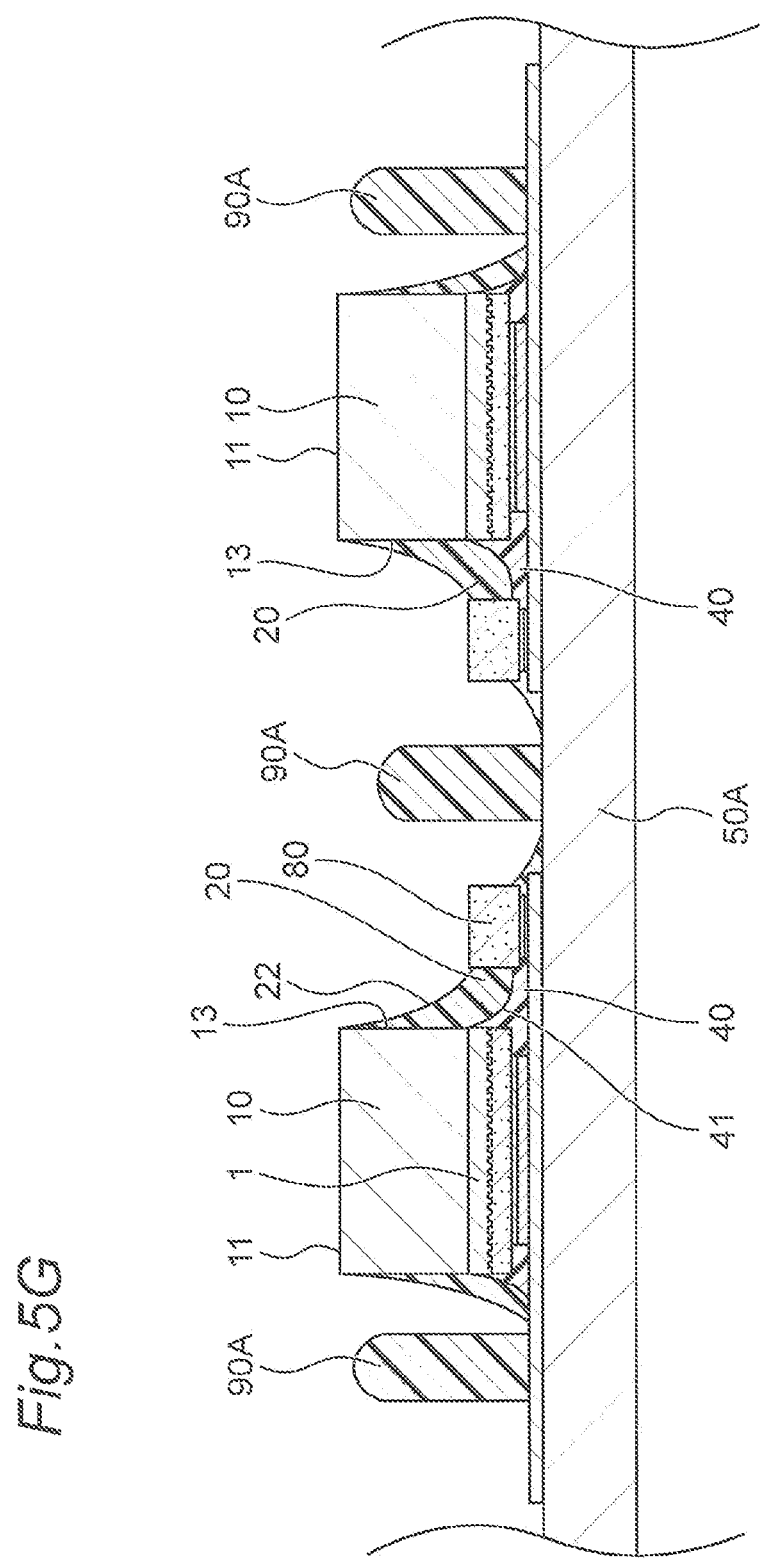
FIG. 5G is a schematic cross-sectional view showing a step in the method of manufacturing a light emitting device according to the first embodiment.

In a step of disposing second light reflecting members, as shown in FIG. 5F, second light reflecting members 40 are disposed in the areas surrounded by the protrusions 90A so as to cover the lateral surfaces 3 of the light emitting elements 1. Specifically, an uncured material for the second light reflecting members 40 is disposed around the protective devices 80 by potting or spraying. The uncured material for the second light reflecting members 40 creeps up onto the lateral surfaces 3 of the light emitting elements 1 by surface tension to cover the lateral surfaces 3 of the light emitting elements 1. This gives the second light reflecting members 40 a shape that spreads towards the collective substrate 50A and first curved surfaces 41 that become more distant from the light emitting elements 1 as they approach the collective substrate 50A. The first curved surfaces 41 are shaped to protrude towards the light emitting elements 1.

(7) Step of Disposing Second Wavelength Conversion Members

In a step of disposing second wavelength conversion members, as shown in FIG. second wavelength conversion members 20 are disposed in the areas surrounded by the protrusions 90A so as to cover the lateral surfaces 13 of the first wavelength conversion members 10. Specifically, an uncured material for the second wavelength conversion members 20 is disposed on the first curved surfaces 41 of the second light reflecting members by potting or spraying. The uncured material for the second wavelength conversion members 20 creeps up onto the lateral surfaces 13 of the first wavelength conversion members 10 by surface tension to cover the lateral surfaces of the first wavelength conversion members 10. This can form second wavelength conversion members 20 each having first oblique surfaces 22 that become more distant from the lateral surfaces 13 of the first wavelength conversion members 10 as they approach the upper surface of the collective substrate 50A. In the light emitting devices 100, the first oblique surfaces 22 are positioned lower than the upper surfaces 11 of the first wavelength conversion members 10 and curved to protrude towards the inner side (i.e., towards the first wavelength conversion members 10 and the light emitting elements 1). The second wavelength conversion members 20, furthermore, cover the first curved surfaces 41 of the second light reflecting members 40. This provides the second wavelength conversion members 20 with second oblique surfaces 23 along the first curved surfaces 41 at the interfaces with the second light reflecting members 40.

(8) Step of Disposing First Light Reflecting Members

Figure 5H:
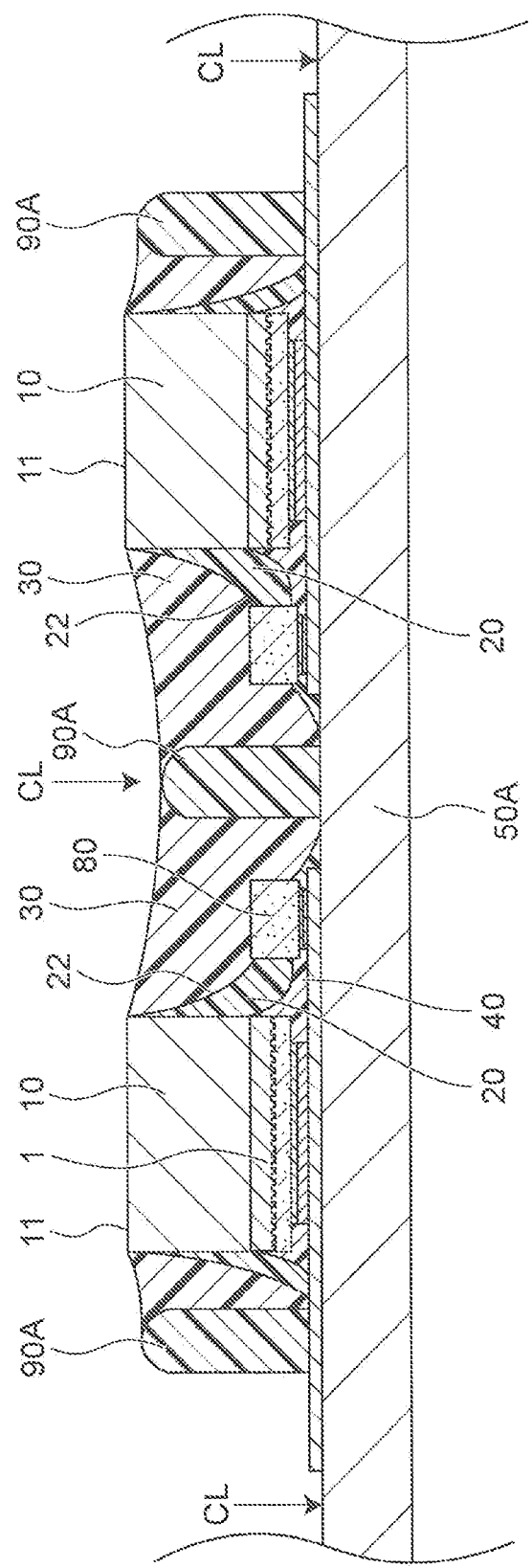
FIG. 5H is a schematic cross-sectional view showing a step in the method of manufacturing a light emitting device according to Embodiment 1.

In a step of disposing first light reflecting members, as shown in FIG. 5H, first light reflecting members 30 are disposed in the areas surrounded by the protrusions 90A. Specifically, an uncured material for the first light reflecting members 30 is disposed on the first oblique surfaces 22 of the second wavelength conversion members 20 by potting or spraying, and allowed to flatten using its own weight. At this time, the amount of the material supplied is preferably adjusted such that the surfaces of the first light reflecting members 30 are along the upper surfaces 11 of the first wavelength conversion members 10, i.e., the surfaces of both are substantially coplanar. Subsequently, the first light reflecting members 30, the second wavelength conversion members 20, and the second light reflecting members 40 are hardened, for example, by heating.

(9) Step of Separating Bock Substrate Into Individual Devices

In a step of separating into individual devices, the block is cut at the cutting position CL indicated as an example in FIG. 5H to obtain light emitting devices 100. For example, a blade is used for the cutting.

By following the manufacturing method described above, a light emitting device 100 that includes a first light reflecting member 30, a second wavelength conversion member and a second light reflecting member 40 can be produced. Furthermore, the first light reflecting members 30, the second wavelength conversion members 20, and the second light reflecting members 40 are preferably hardened successively by heating or the like as they flow into their respective shapes. This can easily achieve desired interfacial shapes between the members. However, the first light reflecting members 30, the second wavelength conversion members 20, and the second light reflecting members 40 may be hardened at the same time. For example, the material for the second light reflecting members 40 may be applied and partly hardened after the second light reflecting members 40 achieve their desired shapes. Then the material for the second wavelength conversion members 20 may be applied and partly hardened after the second wavelength conversion members 20 achieve their desired shapes. After applying the material for the first light reflecting members 30, the first light reflecting members 30, the second wavelength conversion members 20, and the second light reflecting members 40 may be fully hardened at the same time. Each material can be hardened and molded under suitable conditions for the material. The materials are selected such that the hardening conditions for one member do not adversely affect the other members. For the members, the same base material or different base materials may be used.

3. Second Embodiment

Figure 6:
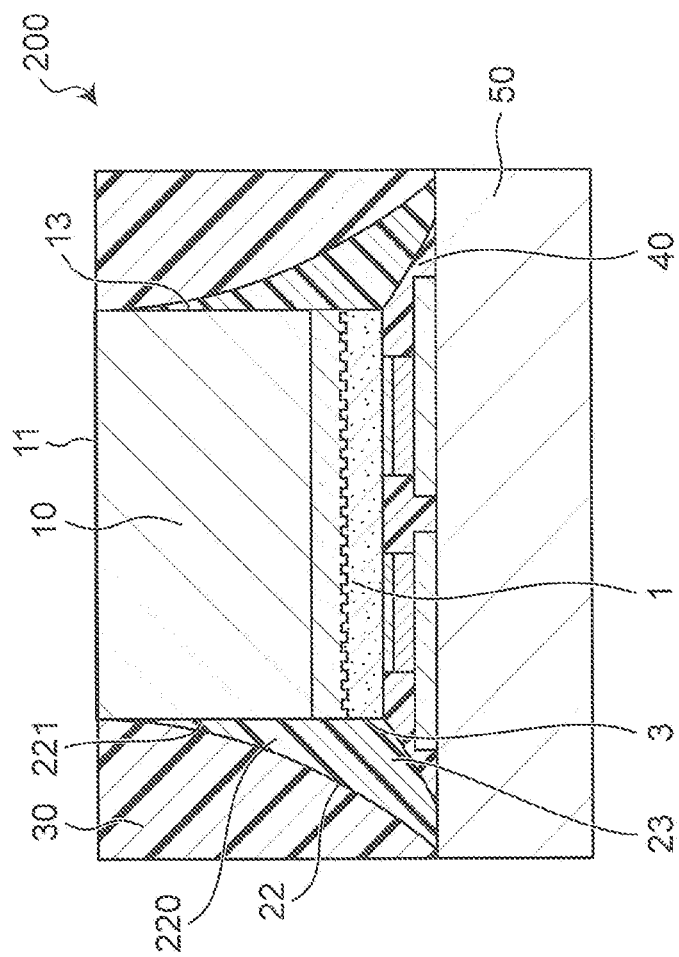
FIG. 6 is a schematic cross-sectional view of a light emitting device according to a second embodiment of the present disclosure.

A light emitting device 200 according to a second embodiment of the present disclosure will be explained with reference to FIG. 6. The light emitting device 200 differs from a light emitting device 100 according to the first embodiment such that the second wavelength conversion member 220 covers the lateral surfaces 3 of the light emitting element 1.

The second wavelength conversion member 220 covers both the lateral surfaces of the first wavelength conversion member 10 and the lateral surfaces 3 of the light emitting element 1. If the light emitting element 1 has a plurality of lateral surfaces, for example, four lateral surfaces, the second wavelength conversion member 220 continuously covers the lateral surfaces of the light emitting element 1. The second wavelength conversion member 220 may cover the lateral surfaces 3 of the light emitting element 1 entirely. It may alternatively cover the lateral surfaces 3 of the light emitting element 1 such that the lower portions of the lateral surfaces are exposed from the second wavelength conversion member 220, for example. In this case, the portions of the lateral surfaces 3 exposed from the second wavelength conversion member 220 are covered by the second light reflecting member 40.

In a light emitting device 200 constructed as above, a portion of the first light exiting the lateral surfaces 3 of the light emitting element 1 is converted by the second wavelength conversion member 220 into third light. A portion of the first light incident on the second wavelength conversion member 220 and the third light that underwent wavelength conversion is reflected by the first oblique surfaces 22 and/or the second oblique surfaces 23 to become incident on the first wavelength conversion member 10 before exiting the upper surface of the first wavelength conversion member 10.

This allows the light emitting device 200 to output white light having predetermined chromaticity. Furthermore, the light emitting device 200 can convert the wavelength of a greater portion of the first light from the light emitting element 1 into third light, and thus can increase the percentage of the third light in the light output by the light emitting device 200.

4. Third Embodiment

Figure 8:
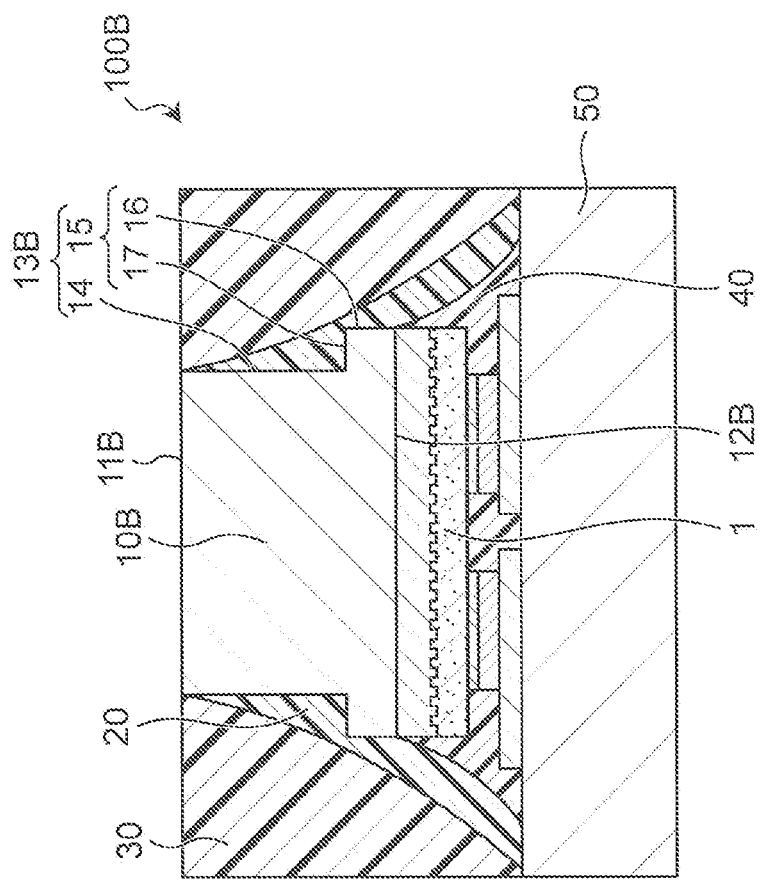
FIG. 8 is a schematic cross-sectional view of a light emitting device according to a third embodiment of the present disclosure.

A light emitting device 100B according to a third embodiment of the present disclosure will be explained with reference to FIG. 8. The light emitting device 100B differs from a light emitting device 100 according to the first embodiment such that the first wavelength conversion member 10B is shaped differently.

The first wavelength conversion member 10 illustrated with reference to the embodiment described earlier was a sheet shaped member in which the upper surface 11 and the lower surface 12 had the same shape and size, but the shape is not limited to this. As in the case of the light emitting device 100B shown in FIG. 8, the first wavelength conversion member may have an upper surface 11B and a lower surface 12B having quadrangular shapes of different sizes.

In the case where the upper surface 11B and the lower surface 12B have different sizes, the lateral surfaces 13B of the first wavelength conversion member 10B include, for example, first lateral surfaces 14 that meet the upper surface 11B and second lateral surfaces 15 that meet the lower surface 12B.

The first lateral surfaces 14 include a plurality of lateral surfaces. Specifically, the first lateral surfaces 14 include four surfaces each connected to a side of the quadrangular upper surface 11B. The four surfaces are, for example, flat surfaces perpendicular to the upper surface 11B.

The second lateral surfaces 15 include a plurality of lateral surfaces. Specifically, the second lateral surfaces 15 include four third lateral surfaces 16 each connected to a side of the quadrangular lower surface 12B and four fourth lateral surfaces 17 each connected to a third lateral surface 16. The four third lateral surfaces 16 are, for example, flat surfaces that perpendicularly meet the lower surface 12B. The four fourth lateral surfaces 17 each connect a third lateral surface 16 and a first lateral surface 14. The fourth lateral surfaces 17 are, for example, flat surfaces that parallel the upper surface 11B and the lower surface 12B.

The first wavelength conversion member 10 constructed as above can reduce the light extraction surface area, thereby making the light emitting device 100B a higher luminance device.

Furthermore, in the lateral surfaces 13B of the first wavelength conversion member constructed as above, the first lateral surfaces 14 and the second lateral surfaces 15 may be continuously covered by the second wavelength conversion member 20. Moreover, the first lateral surfaces 14 and the second lateral surfaces 15 may be entirely covered by the second wavelength member 20. The upper portions of the first lateral surfaces 14, or portions of the first lateral surfaces 14 and the second lateral surfaces 15 may be exposed from the second wavelength conversion member 20.

5. Example

A light emitting device according to the first embodiment was produced as an Example. For the light emitting element, a GaN-based semiconductor light emitting element that emitted first light having a peak emission wavelength of 450 nm was used.

For the first wavelength conversion member, a sheet-shaped sintered body containing as a phosphor an yttrium aluminum garnet based phosphor was used. The first wavelength conversion member emitted second light having a peak emission wavelength in a range of 520 nm to 560 nm.

For the second wavelength conversion member, a silicone resin containing as a light reflecting substance titanium oxide and as a phosphor a BSESN phosphor was used. The titanium oxide content of the second wavelength conversion member was 60 mass parts per 100 mass parts of the silicone resin. The phosphor content of the second wavelength conversion member was 10 mass parts per 100 mass parts of the silicone resin. The second wavelength conversion member emitted third light having a peak emission wavelength in a range of 600 nm to 620 nm.

For the first light reflecting member, a silicone resin containing titanium oxide as a light reflecting substance was used. The titanium oxide content of the first light reflecting member was 60 mass parts per 100 mass parts of the silicone resin. For the second light reflecting member, a silicone resin containing titanium oxide as a light reflecting substance was used. The titanium oxide content of the second light reflecting member was 60 mass parts per 100 mass parts of the silicone resin.

As a light emitting device in Comparative Example 1, a light emitting device similar to that in the Example except for not including a second wavelength conversion member was produced.

Figure 9:
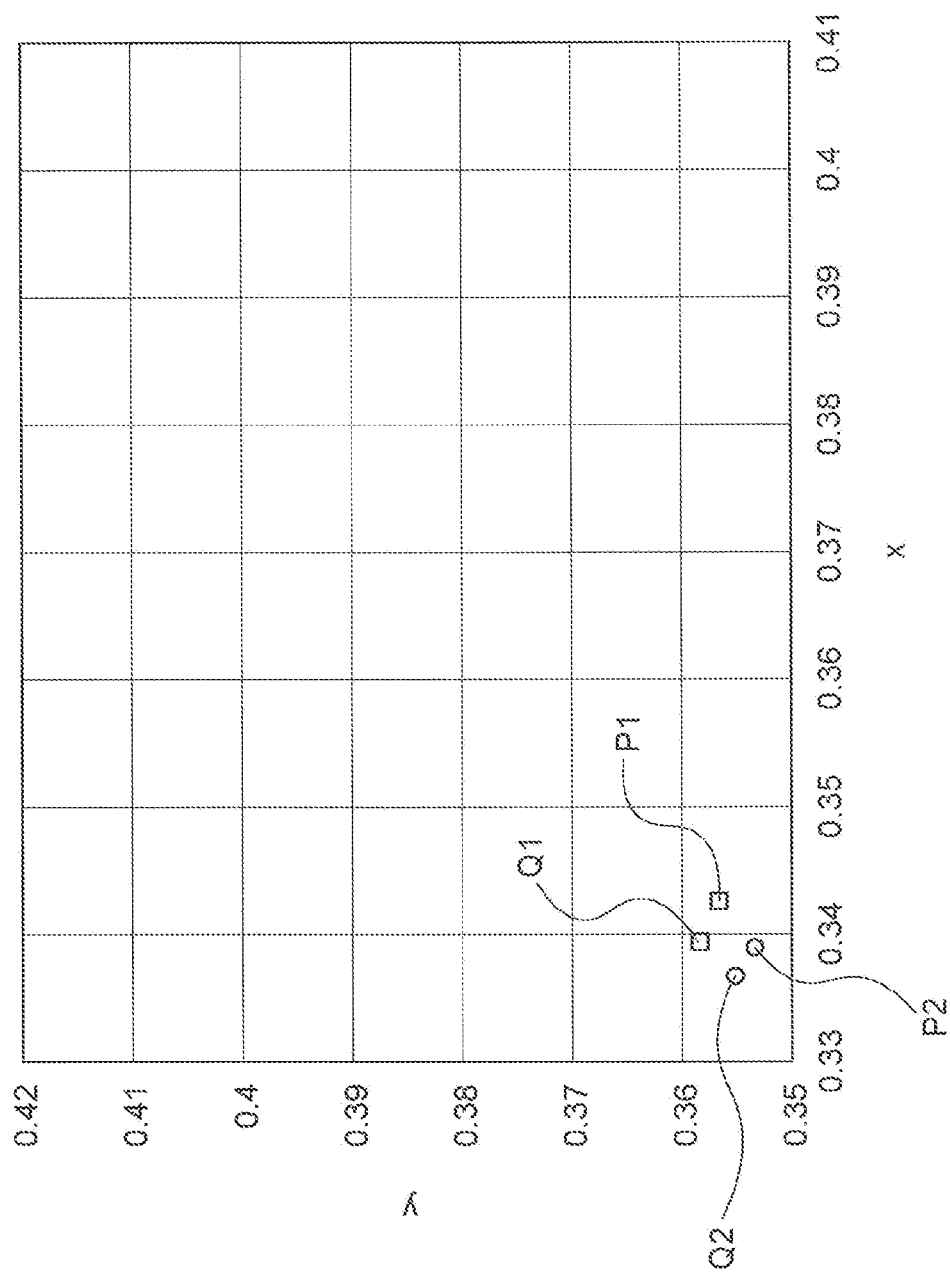
FIG. 9 is a chromaticity coordinate chart plotting the chromaticity of the light output by a light emitting device in an example and the chromaticity of the light output by a light emitting device in a comparative example.

By using an optical measurement system in which a multi-channel spectroscope and an integrating sphere are combined, the x and y chromaticity coordinates in the CIE 1931 color space of the light emitted by the light emitting devices in the Example and Comparative Example 1 were obtained. FIG. 9 is a chromaticity coordinate chart plotting the chromaticity of the light emitted by the light emitting device in the Example and the chromaticity of the light emitted by the light emitting device in the Comparative Example. In FIG. 9, plot P1 represents the chromaticity of the light output by the light emitting device in the Example as a whole. In FIG. 9, plot P2 represents the chromaticity of the light exiting the emission surface in the Example. In FIG. 9, plot Q1 represents the chromaticity of the light output by the light emitting device in the Comparative Example as a whole. In FIG. 9, plot Q2 represents the chromaticity of the light exiting the emission surface in the Comparative Example.

As a result of the comparison between the chromaticity of the light output by the light emitting device in the Example and the chromaticity of the light output by the light emitting device in the Comparative Example based on the chart described above, the chromaticity of the light output by the light emitting device in the Example was found to be closer to red than the light emitted by the light emitting device in the Comparative Example. In other words, the light emitting device in the Example that included a second wavelength conversion member allowed for the adjustment of the chromaticity of the light output by the light emitting device.

A light emitting device according to any of the embodiments of the present disclosure can be used as a light emitting device in a wide range of application areas. For example, it can be suitably used as an automotive headlight.

Certain embodiments of the present invention have been described above. However, changes may be made to the details of the elements described above, allowing for various modifications to the combinations or the sequences of the elements without deviating from the scope of the claims or the spirit of the invention.

What is claimed is:

1. A light emitting device comprising:
   a substrate;
   a light emitting element disposed on the substrate, the light emitting element being configured to emit first light;
   a first wavelength conversion member disposed on the light emitting element and having a lower surface bonded to the light emitting element, an upper surface opposite the lower surface, and a lateral surface that meets the upper surface, the first wavelength conversion member being configured to emit second light when excited by the first light;
   a first light reflecting member disposed on an upper surface of the substrate and covering lateral surfaces of the light emitting element;
   a second wavelength conversion member disposed on the first light reflecting member, on the upper surface of the substrate, and on the lateral surface of the first wavelength conversion member without covering the upper surface of the first wavelength conversion member, the second wavelength conversion member being configured to emit third light when excited by at least one of the first light and the second light.

2. The light emitting device according to claim 1, wherein:
   the second wavelength conversion member comprises a light reflecting substance and a phosphor.

3. The light emitting device according to claim 1, wherein:
   the first light is blue light,
   the second light is yellow light,
   the third light is red light, and
   the light emitting device emits a white light.

4. The light emitting device according to claim 1, wherein:
   the first wavelength conversion member includes a plurality of lateral surfaces, and
   the second wavelength conversion member continuously covers the lateral surfaces of the first wavelength conversion member.

5. The light emitting device according to claim 1, wherein:
the upper surface of the first wavelength conversion member is an emission surface of the light emitting device.

6. The light emitting device according to claim 1, further comprising:
a second light reflecting member, wherein:
the upper portion of the lateral surface of the first wavelength conversion member is exposed from the second wavelength conversion member, and
the second light reflecting member covers the upper portion of the lateral surface of the first wavelength conversion member exposed from the second wavelength conversion member.

7. The light emitting device according to claim 1, wherein:
the lateral surface of the first wavelength conversion member has a first lateral surface that meets the upper surface and a second lateral surface that meets the lower surface, and
the second wavelength conversion member continuously covers the first lateral surface and the second lateral surface of the first wavelength conversion member.

8. The light emitting device according to claim 1, wherein:
the second light has a longer peak wavelength than the peak wavelength of the first light, and
the third light has a longer peak wavelength than the peak wavelength of the second light.

9. The light emitting device according to claim 1, wherein:
the first wavelength conversion member has an upper surface and a lower surface having quadrangular shapes of different sizes.

10. The light emitting device according to claim 1, wherein:
the first wavelength conversion member contains a phosphor that emits second light when excited by the first light.

11. The light emitting device according to claim 1, wherein:
the second wavelength conversion member comprises a resin containing a light reflecting substance and a phosphor.

12. The light emitting device according to claim 11, wherein:
the second wavelength conversion member comprises a silicone resin containing titanium oxide and a BSESN phosphor.

13. The light emitting device according to claim 1, wherein:
the first light reflecting member comprises a resin containing a light reflecting substance.

14. The light emitting device according to claim 1, wherein:
the light emitting element comprises a gallium nitride based semiconductor layer,
the first wavelength conversion member contains an yttrium aluminum garnet based phosphor, and
the second wavelength conversion member contains a BSESN phosphor.

15. The light emitting device according to claim 1, wherein:
the first wavelength conversion member contains a sintered body contains an yttrium aluminum garnet based phosphor.

* * * * *